(12) United States Patent
Takeoka

(10) Patent No.: US 7,808,001 B2
(45) Date of Patent: Oct. 5, 2010

(54) METHOD FOR FABRICATING SEMICONDUCTOR DEVICE AND SEMICONDUCTOR DEVICE

(75) Inventor: Shinji Takeoka, Osaka (JP)

(73) Assignee: Panasonic Corporation, Osaka (JP)

( * ) Notice: Subject to any disclaimer, the term of this patent is extended or adjusted under 35 U.S.C. 154(b) by 714 days.

(21) Appl. No.: 11/808,448

(22) Filed: Jun. 11, 2007

(65) Prior Publication Data

US 2008/0073676 A1 Mar. 27, 2008

(30) Foreign Application Priority Data

Sep. 21, 2006 (JP) .............................. 2006-255379

(51) Int. Cl.
H01L 21/00 (2006.01)

(52) U.S. Cl. .................. 257/69; 257/204; 257/206; 257/351; 257/E21.632; 257/E27.046; 257/E27.064; 257/E27.108; 438/199

(58) Field of Classification Search .................. 257/69, 257/204, 206, 351, E21.632, E27.046, E27.064, 257/E27.108; 438/199, FOR. 187, FOR. 216

See application file for complete search history.

(56) References Cited

U.S. PATENT DOCUMENTS

| 2006/0237816 A1 * | 10/2006 | Nakajima et al. ............ 257/500 |
| 2008/0122002 A1 * | 5/2008 | Pei et al. ...................... 257/369 |
| 2008/0197498 A1 * | 8/2008 | Kaushik et al. .............. 257/754 |
| 2009/0242893 A1 * | 10/2009 | Tomiyasu ...................... 257/72 |

FOREIGN PATENT DOCUMENTS

JP 2004-303789 10/2004

* cited by examiner

Primary Examiner—Thanh V Pham
(74) Attorney, Agent, or Firm—McDermott Will Emery LLP (57) ABSTRACT

An n-channel MOS transistor and a p-channel MOS transistor are formed on a semiconductor substrate 100. The p-channel MOS transistor includes a gate electrode 102a, a first offset sidewall 103a formed on side surfaces of the gate electrode 102a so as to contain fine particles 110 of group IV semiconductor therein. The n-channel MOS transistor includes a gate electrode 102b and a second offset sidewall 103b formed on side surfaces of the gate electrode 102b. After ion implantation of group IV semiconductor, heat treatment is performed to form the fine particles 110, so that a thickness of the first offset sidewall 103a can be made larger than a thickness of the second offset sidewall 103b.

8 Claims, 7 Drawing Sheets

METHOD FOR FABRICATING SEMICONDUCTOR DEVICE AND SEMICONDUCTOR DEVICE

BACKGROUND OF THE INVENTION

1. Field of the Invention

The present invention relates to a field-effect transistor including an off-set sidewall and a sidewall and a method for fabricating the field-effect transistor.

2. Description of the Prior Art

With reduction in the design rule of semiconductor devices, the degree of integration of circuits has been remarkably increased. It is currently possible to mount more than a hundred million field-effect (MOS) transistors on a single chip. To achieve such a chip, not only the development of superfine processing technology, such as lithography, etching or the like, which requires processing accuracy of several tens nanometer order is necessary but also a transistor structure suitable for each of an n-channel MOS transistor and a p-channel MOS transistor has to formed.

As for MOS transistors, conventionally, MOS transistors in which an offset sidewall or a sidewall is formed on each side surface of a gate electrode have been used. Referring to an example in which an offset sidewall is formed, a method for forming an offset sidewall will be briefly described.

First, a gate electrode is formed on a semiconductor substrate, and then an insulation film typified by a silicon oxide film is deposited over a wafer. Subsequently, using a technique such as dry etching and the like, an offset sidewall is formed of an insulator on each of side surfaces of the gate electrode.

However, when an offset sidewall is formed according to the above-described method, an offset sidewall of an n-channel MOS transistor and an offset sidewall of a p-channel MOS transistor have the same thickness. Normally, arsenic, which is hardly diffused by heat, is used in implantation for forming source/drain extensions of an n-channel MOS transistor. On the other hand, boron, which is easily diffused by heat, is used in implantation for forming source/drain extensions of a p-channel MOS transistor. When a transistor is formed, heat treatment typified by impurity activation annealing is simultaneously performed to n-channel and p-channel MOS transistors. Therefore, for example, when an offset sidewall is formed so as to be suitable for an n-channel MOS transistor, the offset sidewall has a small thickness. Then, if an offset sidewall having a small thickness is used for a p-channel MOS transistor, boron overlaps in a wide range under a gate electrode and a transistor of which characteristics are largely degraded due to a short channel effect is formed. In contrast, when an offset sidewall is formed for a p-channel MOS transistor so as to have a large thickness, an amount of boron overlapping is small and an n-channel MOS transistor is offset somewhat. This causes reduction of driving current.

In the transistor generation with a relatively large gate length, an amount of an impurity overlapping under a gate electrode can be adjusted by controlling a dose of an impurity to be implanted or the like. However, in the transistor generation with a very small gate length of 45 nm, 32 nm or the like, the impurity overlapping amount has to be adjusted in a several nanometer order and it is difficult to adjust the impurity overlapping amount only by controlling a dose of an impurity to be implanted. Therefore, formation of a dual offset sidewall which allows optimization for both of an n-channel MOS transistor and a p-channel MOS transistor is desired.

A known method for forming a dual offset sidewall will be described with reference to FIGS. 7A through 7D (see Japanese Laid-Open Publication No. 2004-303789). FIGS. 7A through 7D are cross-sectional views illustrating respective steps for forming a dual offset sidewall according to the known method.

Figure 7A:
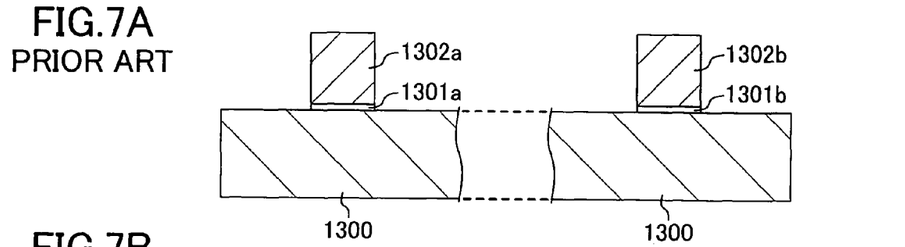
FIGS. 7A through 7D are cross-sectional views illustrating respective steps for forming a dual offset sidewall according to a known method.

First, as shown in FIG. 7A, a first gate insulation film $1301a$ and a first gate electrode $1302a$ of polysilicon are formed in a region (NMOS formation region) of a semiconductor substrate $1300$ and a second gate insulation film $1301b$ and a second gate electrode $1302b$ of polysilicon are formed in another region (PMOS formation region) of the semiconductor substrate $1300$.

Figure 7B:
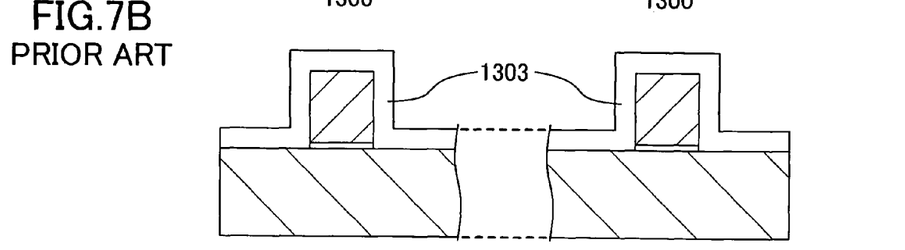

Subsequently, as shown in FIG. 7B, an offset sidewall insulation film $1303$ of a silicon oxide film or the like is deposited over a surface of the semiconductor substrate to a thickness of 10 nm.

Figure 7C:
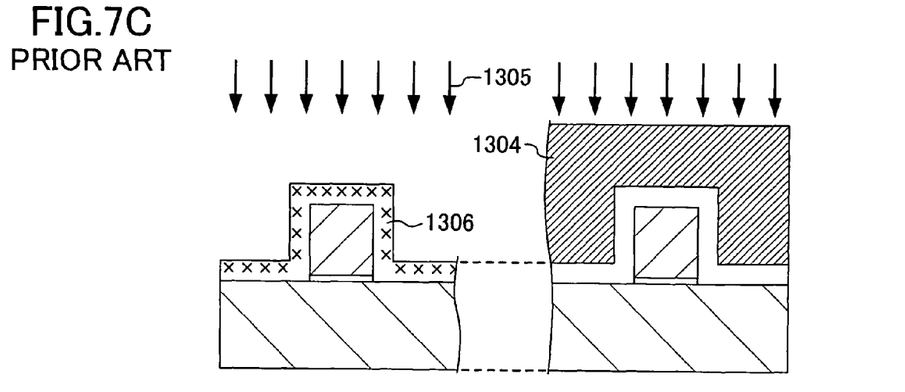
Figure 7D:
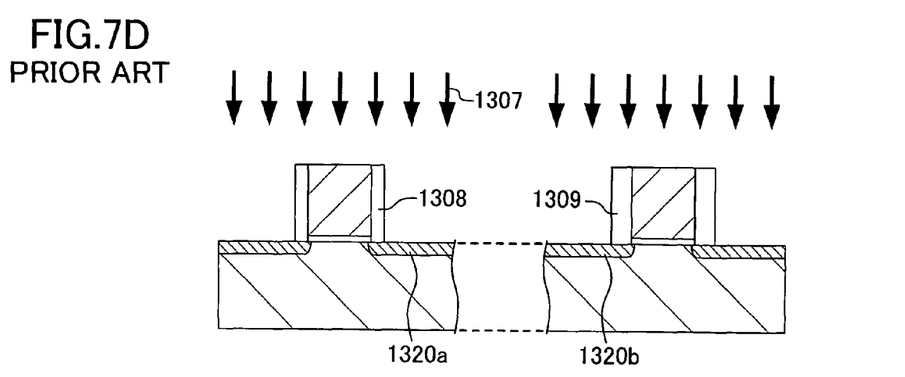

Next, as shown in FIG. 7C, for example, a resist mask $1304$ is provided over the PMOS formation region of the semiconductor substrate $1300$ and then an n-type impurity such as arsenic having a relatively large atomic weight is ion implanted $1305$ in the entire surface of the semiconductor substrate $1300$. In this case, arsenic is ion implanted only in part of the offset sidewall insulation film $1303$ located in the NMOS formation region and an insulation film $1306$ which has been damaged by the ion implantation is formed. An etching rate of the insulation film $1306$ is higher than that of the offset sidewall insulation film $1303$ which has not been damaged by the ion implantation. Therefore, as shown in FIG. 7D, in etching back $1307$, a thickness of the insulation film $1306$ is reduced and an offset sidewall $1308$ is formed on surfaces of the first gate electrode $1302a$ so as to have a smaller thickness than a thickness of an offset sidewall $1309$. Thereafter, using the first gate electrode $1302a$ and the offset sidewall $1308$ as a mask, arsenic is ion implanted into the semiconductor substrate $1300$ with the PMOS formation region covered, thereby forming a first extension region $1320a$. Next, using the second gate electrode $1302b$ and the offset sidewall $1309$ as a mask, boron is ion implanted into the semiconductor substrate $1300$ with the NMOS region covered, thereby forming a second extension region $1320b$.

SUMMARY OF THE INVENTION

However, when a dual offset sidewall is formed according to the above-described method, a thickness of the offset sidewall varies, so that transistor characteristics might become unstable.

It is the point of formation of a dual offset sidewall according to the above-described method that an etching rate of an insulation film in a region in which a thin offset sidewall is desired to be formed is increased to a higher level than an etching rate in some other part. However, according to this method, an element such as arsenic having a large atomic weight is ion implanted into the insulation film and this causes damages on the insulation film. It is very difficult to keep a constant dry etching rate and a constant wet etching rate of the damaged insulation film. Accordingly, a thin offset sidewall itself can be formed but it is difficult to form a thin offset sidewall having a constant thickness.

It is therefore an object of the present invention to provide a semiconductor device of which an extension region or an impurity doped region can be formed with good controllability and a method for fabricating the semiconductor device.

To solve the above-described known problems, the present inventors have found a method for selectively increasing a thickness of desired one of sidewalls provided on side surfaces of gate electrodes.

Specifically, a semiconductor device according to the present invention includes: a semiconductor substrate; a first MOS transistor including a first gate insulation film formed on a first region of the semiconductor substrate, a first gate electrode formed on the first gate insulation film, a first sidewall formed of an insulating material on each side surface of the first gate electrode, fine particles of group IV semiconductor crystal implanted at least in part of the first sidewall and a first impurity doped region of a first conductivity type formed in part of the first region located at a side of the first gate electrode and the first sidewall; and a second MOS transistor including a second gate insulation film formed on a second region of the semiconductor substrate, a second gate electrode formed on the second gate insulation film, a second sidewall formed of an insulating material on each side surface of the second gate electrode so as to have a smaller thickness than a thickness of the first sidewall and a second impurity doped region of a second conductivity type formed in part of the second region located at a side of the second sidewall.

With this structure, fine particles of group IV semiconductor are implanted into part of a first sidewall provided on each side surface of a first gate electrode of a predetermined MOS transistor (the first MOS transistor) of a plurality of MOS transistors provided on a single semiconductor substrate and thus a thickness of the first sidewall is larger than a thickness of a second sidewall provided on each side surface of a second gate electrode of another transistor (the second MOS transistor). Therefore, even when an impurity having conductivity and contained in a first impurity doped region or a first extension region are diffused in a semiconductor device having a reduced size, unnecessary reduction in channel length can be prevented. Moreover, the fine particles and the semiconductor substrate are formed of the same group IV semiconductor, so that there is no concern about adverse effects on the operation of the first MOS transistor.

Each of the first offset sidewall and the second offset sidewall may be formed of silicon oxide.

Respective structures of the first sidewall and the second sidewall are not specifically limited. For example, the fine particles may be formed in the first offset sidewall for forming the first extension region. Alternatively, the fine particles may be implanted in the first doped region formation sidewall provided on a side surface of the first offset sidewall so that the thickness of the first doped region formation sidewall is larger than the thickness of the second doped region formation sidewall.

Specifically, assume that the first MOS transistor is a p-channel MOS transistor and the second MOS transistor is an n-channel MOS transistor. By forming the first sidewall so as to have a larger thickness than the thickness of the second sidewall in the first MOS transistor, boron, which is relatively easy to be diffused, compared to an n-type impurity, can be prevented from being diffused largely under the first gate electrode. Therefore, operation reliability of the semiconductor device can be improved.

The fine particles may be formed of, for example, silicon crystal, germanium crystal, silicon-germanium mixed crystal or the like. Surface portions of the fine particles may be oxidized.

A first method for fabricating a semiconductor device according to the present invention includes: a step a) of forming a first gate electrode on a first region of a semiconductor substrate with a first gate insulation film interposed therebetween and a second gate electrode on a second region of the semiconductor substrate with a second gate insulation film interposed therebetween; after the step a), a step b) of forming an insulating film over the semiconductor substrate; a step c) of selectively implanting ions of group IV semiconductor into part of the insulation film located on the first region; a step d) of performing heat treatment to the semiconductor substrate to form fine particles of group IV semiconductor in the part of the insulating film located on the first region; a step e) of removing part of the insulating film to form a first offset sidewall containing the fine particles implanted therein on each side surface of the first gate electrode and a second offset sidewall on each side surface of the second gate electrode; a step f) of selectively implanting ions of an impurity of a first conductivity type into the first region using the first gate electrode and the first offset sidewall as a mask to form a first extension region in each of parts of the first region located at both sides of the first gate electrode, respectively; and a step g) of selectively implanting ions of an impurity of a second conductivity type into the second region using the second gate electrode and the second offset sidewall as a mask to form a second extension region in each of parts of the second region located at both sides of the second gate electrode, respectively.

According to this method, fine particles are formed in the step c) and the step d), so that a thickness of an insulation film as a base material of a first offset sidewall can be increased by a desired amount. Thus, in the step e), the first offset sidewall can be formed so as to have a larger thickness than a thickness of a second offset sidewall. Specifically, when a p-type impurity such as boron is ion implanted to form a first extension region and an n-type impurity is ion implanted to form a second extension region, a MOS transistor can be formed in anticipation that boron is diffused in a wider range than the n-type impurity in performing heat treatment to activate the impurities. Therefore, an impurity profile can be optimized in a MOS transistor of each conductivity type, so that the occurrence of inconveniences such as too much reduction of a channel in a p-channel MOS transistor and insufficient driving current in an n-channel MOS transistor can be suppressed. Moreover, an increase amount of a thickness of the first offset sidewall can be adjusted in a simple manner by controlling a dose of ions of group IV semiconductor. Thus, even if the size of semiconductor devices is further reduced, a highly reliable semiconductor device can be fabricated with high controllability.

A second method for fabricating a semiconductor device according to the present invention includes: a step a) of forming a first gate electrode on a first region of a semiconductor substrate with a first gate insulation film interposed therebetween and a second gate electrode on a second region of the semiconductor substrate with a second gate insulation film interposed therebetween; after the step a), a step b) of forming a first offset sidewall on each side surface of the first gate electrode and a second offset sidewall on each side surface of the second gate electrode; a step c) of selectively implanting ions of an impurity of a first conductivity type into the first region using the first gate electrode and the first offset sidewall as a mask to form a first extension region in each of parts of the first region located at both sides of the first gate electrode, respectively; a step d) of selectively implanting ions of an impurity of a second conductivity type into the second region using the second gate electrode and the second offset sidewall as a mask to form a second extension region in each of parts of the second region located at both sides of the second gate electrode, respectively; a step e) of forming a first insulating film over the semiconductor substrate; a step f) of selectively implanting ions of group IV semiconductor into part of the insulation film located on the first region; a step g) of performing heat treatment to the semiconductor substrate to form fine particles of group IV semiconductor crystal in the part of the first insulation film on the first region; a step h) of forming a second insulation film of a different material from a material of the first insulation film over the first insulation film; a step i) of removing parts of the first insulation film and the second insulation film to form a first doped region formation sidewall of the first insulation film as a base material on a side surface of the first offset sidewall and the semiconductor substrate so as to contain the fine particles implanted therein and have an L shape, a second doped region formation sidewall of the second insulation film as a base material on a side surface of the first doped region formation sidewall, a third doped region formation sidewall of the first insulation film as a base material on a side surface of the second offset sidewall and the semiconductor substrate so as to have an L shape and a fourth doped region formation sidewall of the second insulation film as a base material on a side surface of the second doped region formation sidewall.

According to this method, a thickness of a first doped region formation sidewall can be adjusted to be a desired value by controlling a dose of ions of group IV semiconductor. Thus, an impurity profile can be optimized in a simple manner, so that a reliable semiconductor device can be fabricated in a stable manner. Moreover, heat treatment is performed after ion implantation of group IV semiconductor, so that an etching rate (removal rate) in part of a first insulation film in which ions are implanted can be suppressed to about the same level as that in the rest part of the first insulation film. Accordingly, variations in offset sidewall thickness due to etching, which have been seen in the known method, can be suppressed.

DESCRIPTION OF THE PREFERRED EMBODIMENTS

First Embodiment

Figure 1:
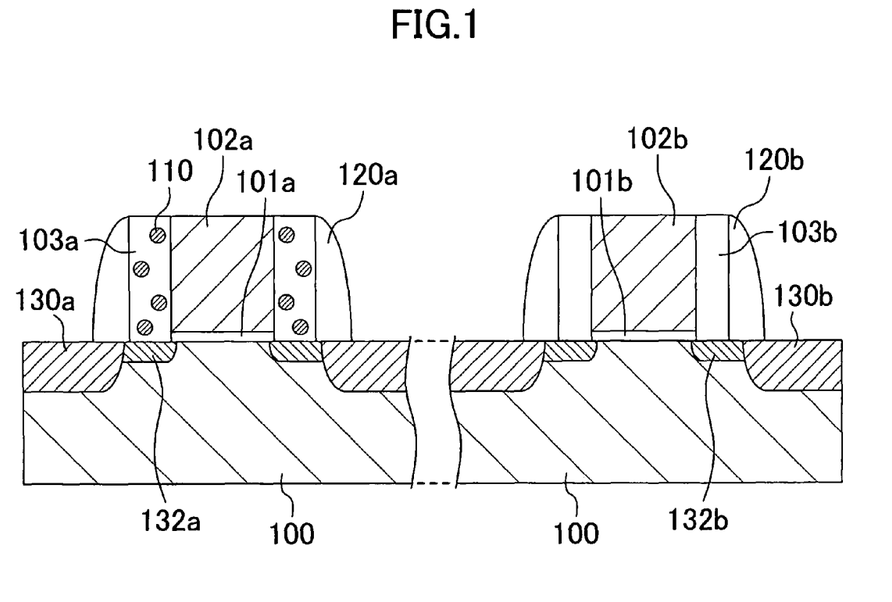
FIG. 1 is a cross-sectional view of a semiconductor device according to a first embodiment of the present invention.

FIG. 1 is a cross-sectional view of a semiconductor device according to a first embodiment of the present invention. In FIG. 1, a p-channel MOS transistor is shown in the left hand side and an n-channel MOS transistor is shown in the right hand side.

As shown in FIG. 1, a semiconductor device according to this embodiment includes a p-channel MOS transistor formed in a PMOS formation region of a semiconductor substrate 100 and an n-channel MOS transistor formed in an NMOS formation region of the semiconductor substrate 100.

The p-channel MOS transistor includes a first gate insulation film 101a formed on the PMOS formation region of the semiconductor substrate 100, a first gate electrode 102a formed of a conductive material such as polysilicon or the like on the first gate insulation film 101a, a first offset sidewall 103a formed of an insulating material on each of side surfaces of the first gate insulation film 101a and the first gate electrode 102a, fine particles 110 of group IV semiconductor crystal implanted so as to be dispersed in the first offset sidewall 103a, a first doped region formation sidewall 120a formed on a side surface of the first offset sidewall 103a, a first extension region 132a formed in each of parts of the semiconductor substrate 100 located at both sides of the first gate electrode 102a, respectively, and under the first offset sidewall 103a so as to contain a p-type impurity, and a first impurity doped region 130a formed in part of the semiconductor substrate 100 located at a side of the first offset sidewall 103a so as to contain a p-type impurity at a higher concentration than a concentration of the p-type impurity in the first extension region 132a.

A thickness of the first offset sidewall 103a is 12 nm, a total volume of the fine particles 110 is about 20% of the sum of volumes of the first offset sidewall 103a and the fine particles 110. The fine particles 110 are formed of silicon crystal, germanium crystal or silicon-germanium mixed crystal and a diameter of the fine particles 110 is, for example, about 3 nm.

The first gate insulation film 101a is formed of, for example, SiON and the first offset sidewall 103a is formed of an insulating material, typified by, for example, a TEOS (tetraethyl orthosilicate) film. Each of the first extension region 132a and the first impurity doped region 130a contains, for example, boron as a p-type impurity.

The n-channel MOS transistor includes a second gate insulation film 101b formed on the NMOS formation region of the semiconductor substrate 100, a second gate electrode 102b formed of polysilicon or the like on the second gate insulation film 101b, a second offset sidewall 103b formed of an insulating material on each of side surfaces of the second gate insulation film 101b and the second gate electrode 102b, a second sidewall 120b formed on a side surface of the second offset sidewall 103b, a second extension region 132b formed in each of parts of the semiconductor substrate 100 located at both sides of the second gate electrode 102b, respectively, and under the second offset sidewall 103b so as to contain an n-type impurity, a second impurity doped region 130b formed in part of the semiconductor substrate 100 located at a side of the second offset sidewall 103b so as to contain an n-type impurity at a higher concentration than a concentration of the n-type impurity in the second extension region 132b. A thickness of the second offset sidewall 103b is about 10 nm. The n-type impurity contained in the second impurity doped region 130b and the second extension region 132b is, for example, arsenic.

The semiconductor device of this embodiment is characterized in that fine particles of group IV semiconductor are formed in the first offset sidewall 103a of the p-channel MOS transistor and thus the thickness of the first offset sidewall 103a is larger than the thickness of the second offset sidewall 103b (in other words, the thickness of the second offset sidewall 103b is smaller than the thickness of the first offset sidewall 103a).

The thickness of the first offset sidewall 103a is larger than the thickness of the second offset sidewall 103b. Thus, in anticipation that boron contained in the first extension region 132a is diffused by heat, a p-channel MOS transistor can be formed. Therefore, while the n-channel MOS transistor is formed in a regular manner, the short channel effect of the p-channel MOS transistor can be prevented. Moreover, the thickness of the first offset sidewall 103a and the size of the fine particles 110 can be precisely adjusted by controlling a dose of group IV semiconductor to be implanted, so that uniform transistor characteristics can be achieved. Group IV semiconductor does not influence conductivity of a transistor and thus the existence of the fine particles 110 does not influence characteristics of the p-channel MOS transistor.

In the description above, the total volume of the fine particles 110 is about 20% of the sum of volumes of the fine particles 110 and the first offset sidewall 103a. However, a volume content of the fine particles 110 is not limited to this value. Moreover, the particle diameter of the fine particles 110 is 3 nm in the description above. However, the particle diameter of the fine particles 110 can be changed and not limited to 3 nm.

In the semiconductor device of this embodiment, SiON is used as a material of a gate insulation film of the MOS transistor. However, some other insulating material such as silicon oxide and the like may be used.

Moreover, each of the first gate electrode 102a and the second gate electrode 102b may be formed so as to have an upper portion or an entire portion silicidized.

—Method for Fabricating a Semiconductor Device—

FIGS. 2A through 2E are cross-sectional views illustrating respective steps for fabricating a semiconductor device according to the first embodiment.

Figure 2A:
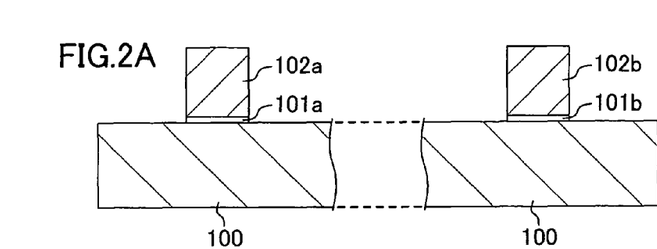
FIGS. 2A through 2E are cross-sectional views illustrating respective steps for fabricating a semiconductor device according to the first embodiment.

First, as shown in FIG. 2A, a first gate insulation film 101a of SiON or the like and a first gate electrode 102a of a conductive material such as polysilicon or the like are formed in this order on a PMOS formation region of a semiconductor substrate 100 formed of silicon or the like. At the same time, a second gate insulation film 101b and a second gate electrode 102b are formed in this order on an NMOS formation region of the semiconductor substrate 100. In this case, each of the first gate insulation film 101a and the second gate insulation film 101b has a thickness of 2 nm. Each of the first gate electrode 102a and the second gate electrode 102b has a thickness of 120 nm. A gate length of each of the first gate electrode 102a and the second gate electrode 102b is 50 nm.

Figure 2B:
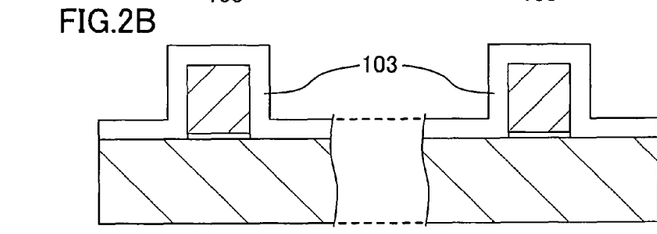

Then, as shown in FIG. 2B, a silicon oxide film 103, typified by a TEOS (tetraethyl orthosilicate) film, formed over the substrate (a semiconductor device being in a process of fabrication) by CVD so as to have a thickness of about 10 nm.

Figure 2C:
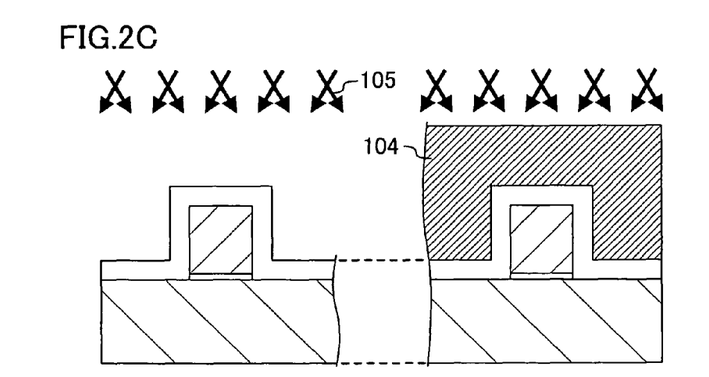

Subsequently, as shown in FIG. 2C, a resist mask 104 is formed on the NMOS formation region of the semiconductor substrate 100 and then ion implantation 105 of silicon is performed to an entire wafer. In this embodiment, silicon is implanted at an energy of 0.5 KeV and a dose of $2 \times 10^{15}$ atoms/cm$^2$. Thus, a profile of silicon ion with a peak at around 5 nm from an upper surface of the silicon oxide film 103 can be obtained.

Figure 2D:
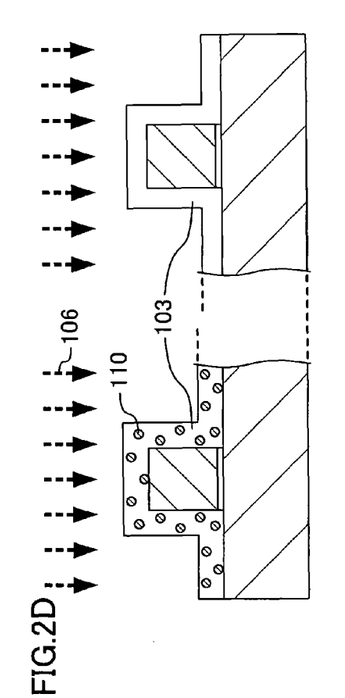

Next, as shown in FIG. 2D, after removal of the resist mask 104, lamp annealing 106 is performed, so that silicon ions dispersed in the silicon oxide film are deposited in the silicon oxide film and fine particles 110 of silicon crystal are formed in part of the silicon oxide film 103 located on the PMOS formation region. In this embodiment, lamp annealing is performed, for example, for 30 seconds at 1100° C. in a nitrogen atmosphere. After this heat treatment has been completed, the silicon oxide film 103 on the PMOS formation region has a thickness of about 12 nm. Part of the silicon oxide film 103 on the PMOS formation region contains 20% silicon crystal by volume.

By performing heat treatment in this step, damages on the silicon oxide film 103 due to ion implantation can be recovered.

Figure 2E:
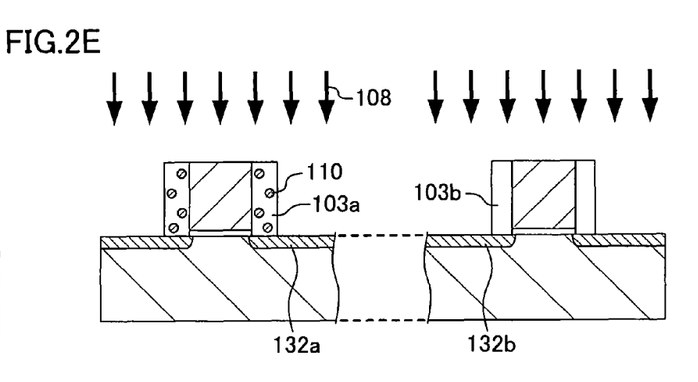

Next, as shown in FIG. 2E, etch back 108 is performed using dry etching. Thus, a first offset sidewall 103a is formed on each of side surfaces of the first gate electrode 102a and a second offset sidewall 103b is formed on each of side surfaces of the second gate electrode 102b. A thickness of the first offset sidewall 103a is 12 nm. A thickness of the second offset sidewall 103b is 10 nm. Thereafter, using the first gate electrode 102a and the first offset sidewall 103a as a mask, boron is ion implanted into the PMOS formation region of the semiconductor substrate 100, thereby forming a first extension region 132a. Subsequently, using the second gate electrode 102b as a mask, arsenic is ion implanted into the NMOS formation region of the semiconductor substrate 100, thereby forming a second extension region 132b. Thereafter, a first doped region formation sidewall is formed on a surface of the first offset sidewall 103a and a second doped region formation sidewall is formed on a surface of the second offset sidewall 103b. As a base material for the first and second doped region formation sidewalls, for example, a silicon oxide film, a laminated film of a silicon nitride film and a silicon oxide film, or a laminated film of a silicon oxide film/a silicon nitride film/a silicon oxide film. Thereafter, using the second doped region formation sidewall and the second gate electrode 102b as a mask, a second impurity doped region is formed and, using the first doped region formation sidewall and the first gate electrode 102a as a mask, a first impurity doped region is formed. In this step, if damages on the silicon oxide film 103 due to ion implantation remain, an etching rate is increased and the thickness of the first offset sidewall 103a is small. Therefore, heat treatment shown in FIG. 2D has to be performed before this step.

As described above, according to the method of this embodiment, the silicon oxide film 103 for forming an offset sidewall is deposited and then, using a resist mask, silicon ions are implanted into a selected region. Thus, the first offset sidewall 103a can be formed on a region in which ions have been implanted so as to have a larger thickness than the thickness of the second offset sidewall 103b in which ions are not implanted. Accordingly, even when boron contained in the first extension region 132a is diffused by heat, part of the first extension region 132a overlapping with the first gate electrode 102a can be reduced when being viewed from the top. Specifically, according to the method of this embodiment, a dose of group IV semiconductor to be implanted can be precisely controlled. Thus, an impurity profile of a MOS transistor of each conductivity type can be optimized and a semiconductor device including a MOS transistor having stable characteristics can be fabricated.

The above-described conditions for ion implantation of silicon are mere examples. A dose of ions in ion implantation may be changed to appropriately adjust the thickness of the first offset sidewall 103a. Also, temperature and time for lamp annealing may be set to be different conditions from the above-described temperature and time. Moreover, lamp annealing may be performed not only in a nitrogen atmosphere but also in an atmosphere which does not contain oxygen, for example, in an atmosphere of inert gas of argon or the like or in vacuum.

Moreover, according to the method of this embodiment, silicon is ion implanted. However, germanium may be ion implanted to form fine particles of germanium. Alternatively, after silicon has been ion implanted, germanium may be ion implanted to form fine particles of mixed crystal of silicon and germanium. An annealing temperature in formation of fine particles of silicon is 1100° C. or more. However, when fine particles of mixed crystal of silicon and germanium or fine particles of germanium are formed, an annealing temperature in the step of FIG. 2D can be set to be 800-1100° C. or 800° C. or more. That is, an annealing temperature may be set to be lowered. Therefore, even when a film of a high k insulating material such as HfSiON material and the like, which is rather unstable thermally, is used as a gate insulation film, the method of this embodiment can be applied. When fine particles of mixed crystal of silicon and germanium or silicon crystal are formed, an annealing temperature is higher than the case where fine particles of single crystal of germanium are formed and thus an offset sidewall which is highly resistant to etching can be formed.

After the step of FIG. 2E, the first gate electrode 102a and the second gate electrode 102b may be silicidized with Ni and Pt. As another option, after removal of polysilicon, a groove made by the first offset sidewall 103a and the second offset sidewall 103b may be filled with metal to form a metal gate electrode.

Moreover, a region in which group IV semiconductor is ion implanted does not have to be the PMOS formation region. Group IV semiconductor can be ion implanted into an arbitrary region to increase a thickness of a sidewall.

In this embodiment, the example in which fine particles are formed in an offset sidewall for adjusting a width of an overlapping portion of an extension region and a gate electrode has been described. If an extension region is not provided, fine particles may be formed in a regular sidewall, so that a position of an impurity doped region can be controlled. Specifically, if fine particles are formed at least in part of the whole body of sidewall including combination of an offset sidewall for forming an extension region and a sidewall for forming an impurity doped region and the whole body of the sidewall has an increased thickness, a MOS transistor having an optimal impurity profile can be formed.

Second Embodiment

Figure 3:
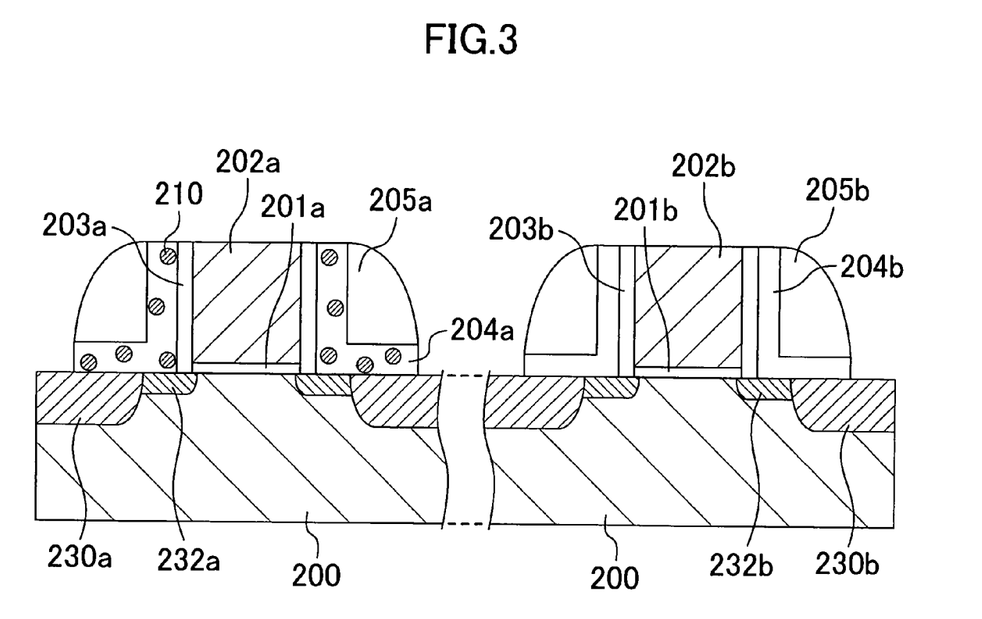
FIG. 3 is a cross-sectional view illustrating a semiconductor device according to a second embodiment of the present invention.

Hereafter, a semiconductor device according to a second embodiment of the present invention will be described with reference to FIG. 3. FIG. 3 is a cross-sectional view illustrating a semiconductor device according to the second embodiment.

As shown in FIG. 3, the semiconductor device of this embodiment includes a p-channel MOS transistor formed in a PMOS formation region of a semiconductor substrate 200 and an n-channel MOS transistor formed in a NMOS formation region of the semiconductor substrate 200.

The p-channel MOS transistor includes a first gate insulation film 201a formed on the PMOS formation region of the semiconductor substrate 200, a first gate electrode 202a formed of polysilicon or the like on the first gate insulation film 201a, a first offset sidewall 203a formed of an insulating material on each of side surfaces of the first gate insulation film 201a and the first gate electrode 202a, a first doped region formation sidewall 204a formed on a side surface of the first offset sidewall 203a and the semiconductor substrate 200 so as to have an L shape, fine particles 210 of group IV semiconductor crystal implanted so as to be dispersed in the first doped region formation sidewall 204a, a second doped region formation sidewall 205a formed of a different insulating material from an insulating material of the first doped region formation sidewall 204a on a side surface of the first doped region formation sidewall 204a, a first extension region 232a formed in each of parts of the semiconductor substrate 200 located at both sides of the first gate electrode 202a, respectively, and under the first offset sidewall 203a so as to contain a p-type impurity, and a first impurity doped region 230a formed in part of the semiconductor substrate 200 located at a side of the first offset sidewall 203a so as to contain a p-type impurity at a higher concentration than a concentration of the p-type impurity in the first extension region 232a.

A total volume of the fine particles 210 is about 20% of the sum of volumes of the first doped region formation sidewall 204a and the fine particles 210. The fine particles 210 are formed of silicon crystal, germanium crystal or silicon-germanium mixed crystal and a diameter of the fine particles 210 is, for example, about 3 nm.

The first doped region formation sidewall 204a is formed of, for example, silicon oxide and has a thickness of about 12 nm. The second doped region formation sidewall 205a is formed of, for example, silicon nitride and has a thickness of about 30 nm.

The first gate insulation film 201a is formed of, for example, SiON and the first offset sidewall 203a is formed of an insulating material, typified by, for example, a TEOS (tetraethyl orthosilicate) film. Each of the first extension region 232a and the first impurity doped region 230a contains, for example, boron as a p-type impurity.

The n-channel MOS transistor includes a second gate insulation film 201b formed on the NMOS formation region of the semiconductor substrate 200, a second gate electrode 202b formed of polysilicon or the like on the second gate insulation film 201b, a second offset sidewall 203b formed of an insulating material on each of side surfaces of the second gate insulation film 201b and the second gate electrode 202b, a third doped region formation sidewall 204b formed on a side surface of the second offset sidewall 203b and the semiconductor substrate 200 so as to have an L shape, a fourth doped region formation sidewall 205b formed of a different insulating material from an insulating material for the third doped region formation sidewall 204b on a side surface of the third doped region formation sidewall 204b, a second extension region 232b formed in each of parts of the semiconductor substrate 200 located at both sides of the second gate electrode 202b, respectively, and under the second offset sidewall 203b so as to contain an n-type impurity, a second impurity doped region 230b formed in part of the semiconductor substrate 200 located at a side of the second offset sidewall 203b so as to contain an n-type impurity at a higher concentration than a concentration of the n-type impurity in the second extension region 232b. The n-type impurity contained in the second impurity doped region 230b and the second extension region 232b is, for example, arsenic.

The third doped region formation sidewall 204b is formed of, for example, silicon oxide and has a smaller thickness than the thickness of the first doped region formation sidewall 204a, i.e., about 10 nm. The fourth doped region formation sidewall 205b is formed of, for example, silicon nitride and has a thickness of about 30 nm. The second gate insulation film 201b is formed of, for example, SiON, and the second offset sidewall 203b is formed of an insulating material, typified by, for example, a TEOS (tetraethyl orthosilicate) film.

The semiconductor device of this embodiment is characterized in that fine particles of group IV semiconductor are formed in the first doped region formation sidewall 204a of the p-channel MOS transistor and thus the thickness of the first doped region formation sidewall 204a is larger than the thickness of the third doped region formation sidewall 204b.

The thickness of the first doped region formation sidewall 204a is larger than the third doped region formation sidewall 204b. Thus, in anticipation that boron contained in the first impurity doped region 230a is diffused by heat, a p-channel MOS transistor can be formed. Therefore, without reducing a driving current of the n-channel MOS transistor, the short channel effect of the p-channel MOS transistor can be prevented. Moreover, the thickness of the first doped region formation sidewall 204a and the size of the fine particles 210 can be precisely controlled by adjusting a dose of group IV semiconductor to be implanted, so that uniform transistor characteristics can be achieved.

In the description above, the total volume of the fine particles 210 is about 20% of the sum of volumes of the fine particles 210 and the first doped region formation sidewall 204a. However, a volume content of the fine particles 210 is not limited to this value. Moreover, the particle diameter of the fine particles 210 is 3 nm in the description above. However, the particle diameter of the fine particles 210 can be changed and not limited to 3 nm.

In the semiconductor device of this embodiment, SiON is used as a material of a gate insulation film of the MOS transistor. However, some other insulating material such as silicon oxide and the like may be used.

Moreover, each of the first gate electrode 202a and the second gate electrode 202b may be formed so as to have an upper portion or an entire portion silicidized with Ni.

In this embodiment, the example in which a sidewall having a two-layer structure of a nitride film and an oxide film is used has been described. However, the present invention is not limited thereto but the same effects can be achieved for a single-layer oxide film sidewall and a sidewall having a three-layer structure of an oxide film, a nitride film and an oxide film.

In the semiconductor device of this embodiment, SiON is used as a material of a gate insulation film of the MOS transistor. However, some other insulating material such as silicon oxide and the like may be used.

Moreover, each of the first gate electrode 202a and the second gate electrode 202b may be formed so as to have an upper portion or an entire portion silicidized with Ni.

—Method for Fabricating a Semiconductor Device—

FIGS. 4A through 4F are cross-sectional views illustrating respective steps for fabricating a semiconductor device according to the second embodiment.

Figure 4A:
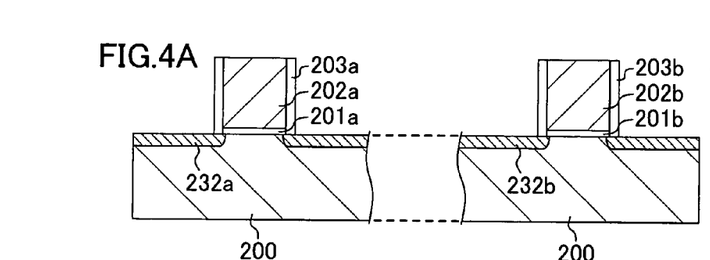
FIGS. 4A through 4F are cross-sectional views illustrating respective steps for fabricating a semiconductor device according to the second embodiment.

First, as shown in FIG. 4A, a first gate insulation film 201a and a first gate electrode 202a are formed in this order on a PMOS formation region of a semiconductor substrate 200. At the same time, a second gate insulation film 201b and a second gate electrode 202b are formed in this order on an NMOS formation region of the semiconductor substrate 200. In this case, each of the first gate insulation film 201a and the second gate insulation film 201b has a thickness of 2 nm. Each of the first gate electrode 202a and the second gate electrode 202b has a thickness of 120 nm. A gate length of each of the first gate electrode 202a and the second gate electrode 202b is 50 nm. Subsequently, a first offset sidewall 203a is formed of a TEOS film or the like on each of side surfaces of the first gate electrode 202a so as to have a thickness of 10 nm and a second offset sidewall 203b is formed of a TEOS film or the like on each of side surfaces of the second gate electrode 202b so as to have a thickness of 100 nm. Thereafter, using the first gate electrode 202a and the first offset sidewall 203a as a mask, boron is ion implanted into the PMOS formation region of the semiconductor substrate 200, thereby forming a first extension region 232a. Next, using the second gate electrode 202b and the second offset sidewall 203b as a mask, arsenic is ion implanted into the NMOS formation region of the semiconductor substrate 200, thereby forming a second extension region 232b. In this step, pocket implantation may be performed to parts of the semiconductor substrate 200 located under the first gate electrode 202a and the second gate electrode 202b before formation of offset sidewalls as necessary.

Figure 4B:
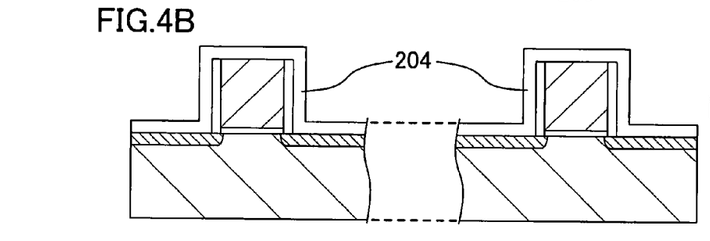

Subsequently, as shown in FIG. 4B, a sidewall insulation film 204 is deposited over an upper surface of the substrate by CVD. A silicon oxide film, typified by a TEOS film, is used as the sidewall insulation film 204 and a thickness of the sidewall insulation film 204 is 10 nm.

Figure 4C:
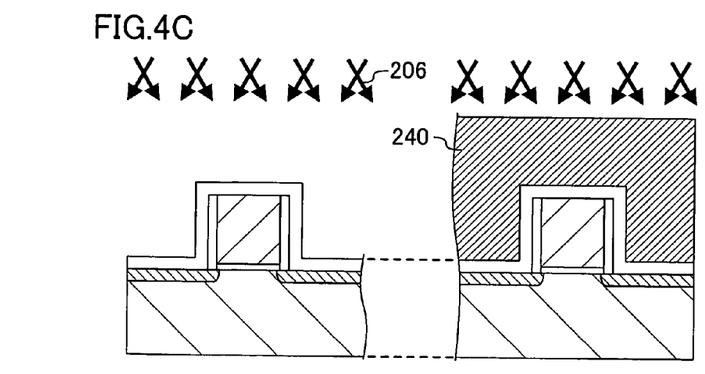

Next, as shown in FIG. 4C, a resist mask 240 is formed on the NMOS formation region of the semiconductor substrate 200. Thereafter, ion implantation 206 of germanium is performed to the semiconductor substrate 200. In this embodiment, germanium is implanted at an energy of 1.5 KeV and a dose of $2 \times 10^{15}$ atoms/cm$^2$. Thus, a profile of germanium ion with a peak at around 5 nm from the upper surface of the silicon oxide film 103 can be obtained.

Figure 4D:
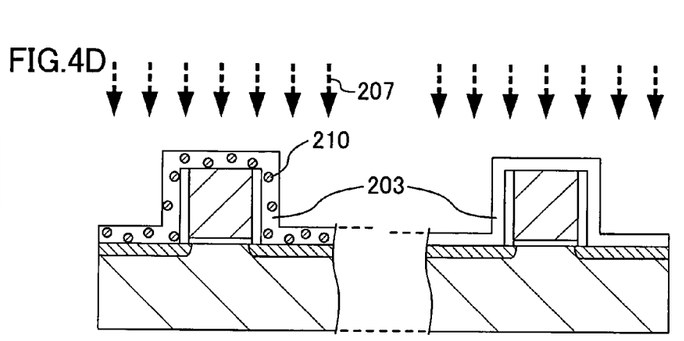

Subsequently, as shown in FIG. 4D, after removal of the resist mask 240, lamp annealing 207 is performed, so that germanium ions dispersed in the sidewall insulation film 204 are deposited in the sidewall insulation film 204 and fine particles 210 are formed. Moreover, damages on the sidewall insulation film 204 due to implantation of germanium ions are recovered. In this embodiment, lamp annealing is performed, for example, for 30 seconds at 800° C. in a nitrogen atmosphere. After this heat treatment has been completed, part of the sidewall insulation film 204 located on the PMOS formation region has a thickness of 12 mm. The ratio of the volume of the fine particles 210 to the total of the volume of the part of the sidewall insulation film 204 located on the PMOS formation region contains and the volume of the fine particles 210 is about 20%.

Figure 4E:
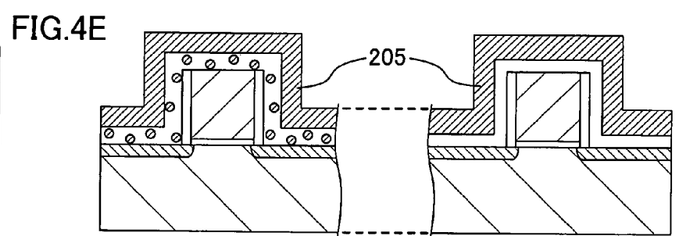

Next, as shown in FIG. 4E, a sidewall nitride film 205 is deposited over the upper surface of the substrate (a semiconductor device being in a process of fabrication) so as to have a thickness of about 30 nm.

Figure 4F:
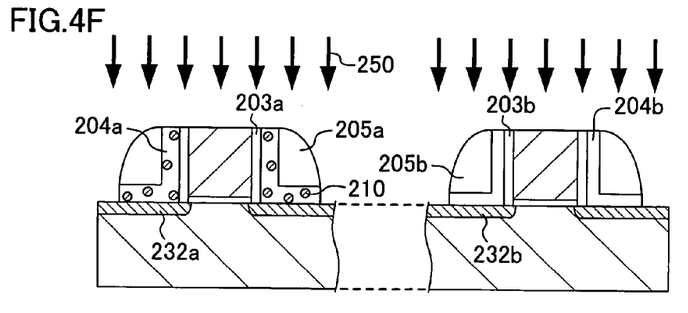

Next as shown in FIG. 4F, etch back 250 is performed using dry etching. Thus, a first doped region formation sidewall 204a is formed on a surface of the first offset sidewall 203a and the first extension region 232a so as to have the fine particles 210 implanted and an L shape, and a second doped region formation sidewall 205a is formed over the first doped region formation sidewall 204a. At the same time, a third doped region formation sidewall 204b is formed on a side surface of the second offset sidewall 203b and the second extension region 232b so as to have an L shape, and a fourth doped region formation sidewall 205b is formed on the third doped region formation sidewall 204b. A thickness of the first doped region formation sidewall 204a in which the fine particles 210 of germanium crystal are implanted is 12 mm and a thickness of the third doped region formation sidewall 204b is 10 mm. Thereafter, with the PMOS formation region covered, using the second gate electrode 202b, the second offset sidewall 203b, the third doped region formation sidewall 204b and the fourth doped region formation sidewall 205b as a mask, an n-type impurity is ion implanted into the semiconductor substrate 200, thereby forming a second impurity doped region 230b (not shown). Next, with the NMOS formation region covered, using the first gate electrode 202a, the first offset sidewall 203a, the first doped region formation sidewall 204a and the second doped region formation sidewall 205a as a mask, a p-type impurity is ion implanted into the semiconductor substrate 200, thereby forming a first impurity doped region 230a. In the above-described manner, the semiconductor device of this embodiment described by FIGS. 4A through 4F can be fabricated.

As has been described, according to the method of this embodiment, germanium ions are implanted into desired part of a semiconductor substrate. Thus, a thickness of a sidewall formed on the desired part can be made larger than a thickness of a sidewall in other part. A thickness of a sidewall can be precisely adjusted to be a desired value by controlling a dose of germanium ions. Accordingly, a sidewall of a p-channel MOS transistor can be formed so as to have a large thickness and thus boron contained in the first impurity doped region 230a can be prevented from being diffused in part of the semiconductor substrate located immediately under a gate electrode. Germanium is group IV semiconductor and does not influence transistor characteristics.

According to the method of this embodiment, the example in which fine particles of germanium crystal are formed in a sidewall has been described. However, fine particles of silicon crystal or a mixed crystal of silicon and germanium may be formed in a sidewall.

The above-described conditions for ion implantation of germanium are mere examples and can be adjusted according to a desired thickness of a sidewall. Also, the above-descried temperature and time for lamp annealing are mere examples. Lamp annealing temperature and time are not limited thereto as long as temperature and time are set to be within a range in which germanium nano crystal is deposited in a silicon oxide film. Moreover, lamp annealing may be performed not only in a nitrogen atmosphere but also in an atmosphere which does not contain oxygen, for example, in an atmosphere of inert gas of argon or the like or in vacuum.

Moreover, a region in which group IV semiconductor is ion implanted does not have to be the PMOS formation region. Group IV semiconductor can be ion implanted, using a resist mask, into an arbitrary region to increase a thickness of a sidewall.

Surfaces of fine particles have not been mentioned in this embodiment, but surface portions of fine particles may be oxidized using a method to be described in the following embodiment.

According to the method of this embodiment, an offset sidewall is formed on a side surface of a gate electrode. However, an offset sidewall is not necessarily needed.

Third Embodiment

Figure 5:
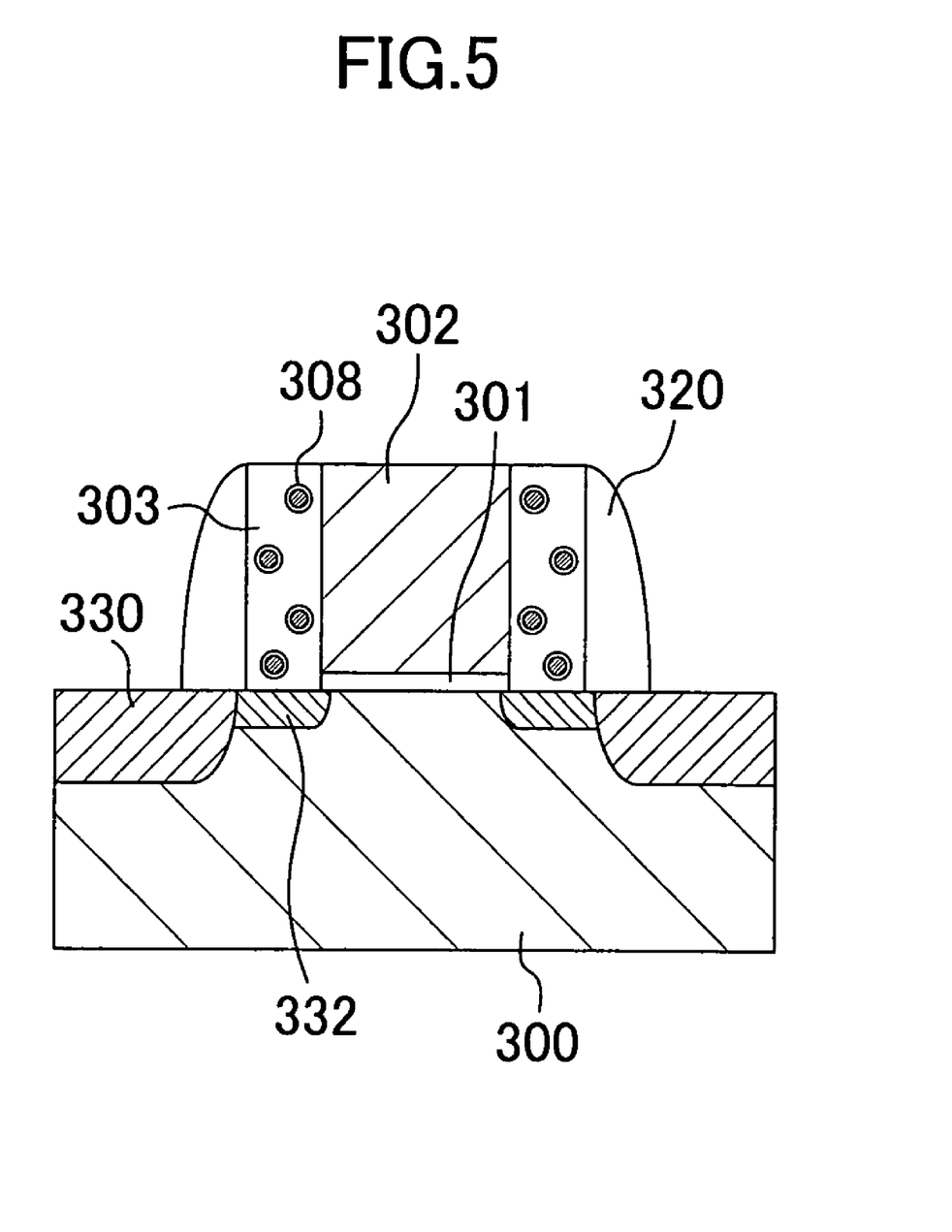
FIG. 5 is a cross-sectional view illustrating a semiconductor device according to a third embodiment of the present invention.

FIG. 5 is a cross-sectional view illustrating a semiconductor device according to a third embodiment of the present invention. A semiconductor device according to this embodiment includes fine particles 308 with a different composition from a composition of fine particles in the semiconductor device of the first embodiment. Other than that, the semiconductor device of this embodiment has the same structure of the semiconductor device of the first embodiment.

For example, as shown in FIG. 5, a MOS transistor of this embodiment includes a gate insulation film 301 formed on a semiconductor substrate 300, a gate electrode 302 formed of polysilicon or the like on the gate insulation film 301, an offset sidewall 303 formed of an insulating material on the gate insulation film 301 and each of side surfaces of the gate electrode 302, a sidewall 320 formed on a side surface of the offset sidewall 303, fine particles 308 of group IV semiconductor crystal dispersed in the offset sidewall 303, an extension region 332 formed in each of parts of the semiconductor substrate 300 located at both sides of the gate electrode 302, respectively, and under the offset sidewall 303 so as to contain a p- or n-type impurity, and an impurity doped region 330 formed in part of the semiconductor substrate 300 located at a side of the offset sidewall 303 so as to contain an impurity of the same conductivity type as that of the impurity in the extension region 332 at a higher concentration than the concentration of the impurity in the extension region 332.

This embodiment is characterized in that the fine particles 308 are formed of silicon crystal, germanium crystal or silicon-germanium mixed crystal and surface portions of the fine particles 308 are oxidized. A diameter of the fine particles 308 is about 2 nm and part of each of the fine particles 308 extending from a surface thereof by a distance of 0.5 nm is oxidized. A thickness of the offset sidewall 303 in which the fine particles 308 are implanted is 12 nm. The thickness of the offset sidewall 303 is about 2 nm larger than a thickness of an offset sidewall in which the fine particles 308 are not implanted. In this case, a volume of the fine particles 308 is about 15% of a total of the volume of the fine particles 308 and a volume of the offset sidewall 303.

An SiON film is used as the gate insulation film 301 and a silicon oxide film, typified by a TEOS film, is used as the offset sidewall 303.

Although not shown in FIG. 5, a MOS transistor including an offset sidewall which does not contain the fine particles 308 may be further provided on the semiconductor substrate 300.

Next, a method for fabricating a semiconductor device according to this embodiment will be described. FIGS. 6A through 6F are cross-sectional views illustrating respective steps for fabricating the semiconductor device of this embodiment.

Figure 6A:
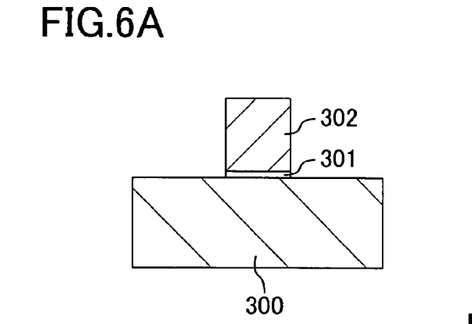
FIGS. 6A through 6F are cross-sectional views illustrating respective steps for fabricating the semiconductor device of the third embodiment.

First, as shown in FIG. 6A, for example, a gate insulating film 301 of SiON and a gate electrode 302 of polysilicon are formed on a semiconductor substrate 300. A thickness of the gate insulation film 301 is 2 nm. Moreover, the gate electrode 302 is formed so as to have a height of 120 nm and a gate length of 50 nm.

Figure 6B:
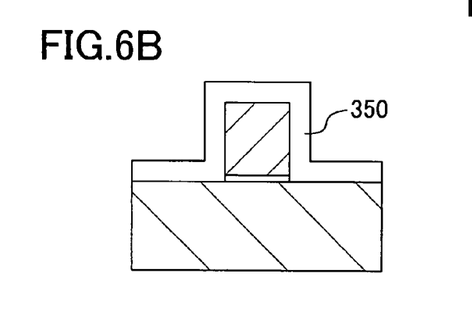

Subsequently, as shown in FIG. 6B, an offset sidewall insulation film 350 is deposited over an upper surface of a substrate (a semiconductor device being in a process of fabrication) by CVD. The offset sidewall insulation film 350 is formed of a silicon oxide film, typified by a TEOS film, so as to have a thickness of about 10 nm.

Figure 6C:
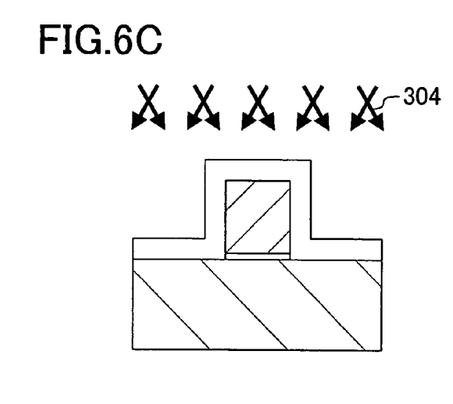

Next, as shown in FIG. 6C, ion implantation of silicon 304 for the offset sidewall insulation film 350 is performed to an entire upper surface of a wafer, so that the offset sidewall insulation film 350 excessively contains silicon ions. In this embodiment, silicon is implanted at an energy of 0.5 KeV and a dose of $1.6 \times 10^{15}$ atoms/cm$^2$. Thus, a profile of silicon ion with a peak at around 5 nm from a surface of the offset sidewall insulation film 350 can be obtained.

Figure 6D:
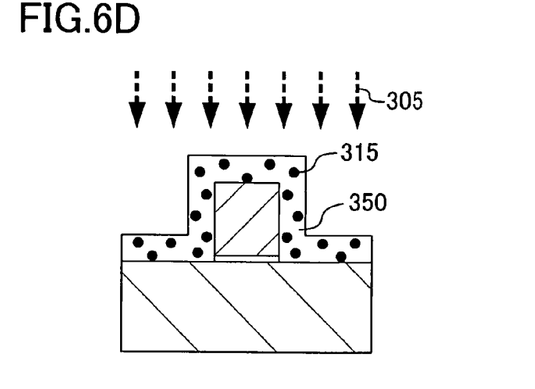

Subsequently, as shown in FIG. 6D, lamp annealing 305 is performed, so that silicon ions dispersed in the offset sidewall insulation film 350 are deposited in the offset sidewall insulation film 350 and fine particles 308 of silicon crystal are formed. Moreover, by performing lamp annealing 305, damages on the offset sidewall insulation film 350 due to ion implantation are recovered. In this step, lamp annealing is performed for 30 seconds at 1100° C. in a nitrogen atmosphere. After this heat treatment has been completed, the offset sidewall insulation film 350 has a thickness of 11.5 nm. The offset sidewall insulation film 350 contains 15% fine particles 308 by volume.

Figure 6E:
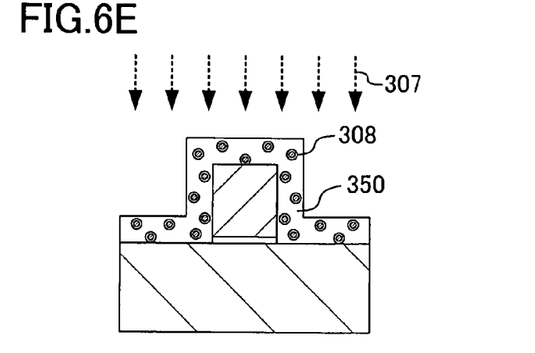

Next, as shown in FIG. 6E, annealing 307 is performed in an oxygen containing atmosphere, thereby oxidizing surface portions of the fine particles 308 deposited in the step of FIG.

6D. In this embodiment, annealing 307 is performed for 1 minute at 1000° C. in a 10% diluted oxygen atmosphere, so that part of each of the fine particles 308 extending from a surface thereof by a distance of about 0.5 nm is oxidized. In this oxidization step, the thickness of the offset sidewall insulation film 350 is further increased to be about 12 nm.

Figure 6F:
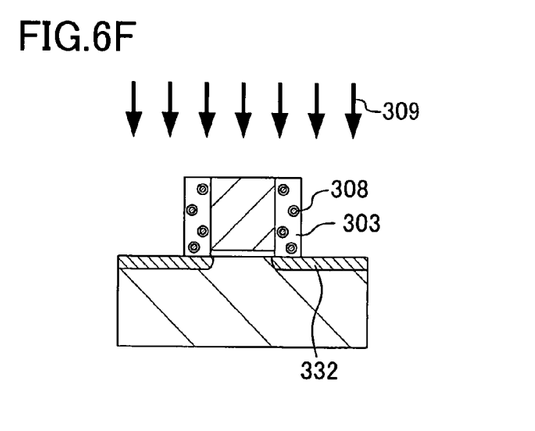

Next, as shown in FIG. 6F, etch back 309 is performed using dry etching. Thus, a offset sidewall 303 in which the fine particles 308 are implanted is formed on each of side surfaces of the gate electrode 302. In this embodiment, a thickness of the offset sidewall 303 is 12 nm. Thereafter, using the gate electrode 302 as a mask, an impurity is ion implanted into the semiconductor substrate 300, thereby forming an extension region 332 in each of parts of the semiconductor substrate 300 located in both sides of the gate electrode 302, respectively. When a p-channel MOS transistor is desired to be formed, boron is ion implanted in this step, and when an n-MOS transistor is desired to be formed, arsenic is ion implanted in this step.

In etch back 309 is performed, if damages on the offset sidewall insulation film 350 due to ion implantation remain, an etching rate is increased. Therefore, specifically, when the offset sidewall 303 is formed simultaneously with an offset sidewall in which fine particles are not implanted, the thickness of the offset sidewall 303 is reduced. In contrast, if heat treatment of FIG. 6D is performed before this step, the etching rate of the offset sidewall insulation film 350 can be made substantially uniform in both of a region in which ion implantation has been performed and a region in which ion implantation has not been performed.

Thereafter, after formation of a sidewall on a side surface of the offset sidewall 303, using the offset sidewall 303 and the gate electrode 302 as a mask, an impurity is ion implanted, thereby forming an impurity doped region (not shown) in part of the semiconductor substrate 300 located at a side of the offset sidewall 303. Thus, the semiconductor device of this embodiment is formed.

According to the method of this embodiment, the thickness of the offset sidewall 303 can be adjusted by performing oxidization of the surface portions of the fine particles 308, in addition to ion implantation of group IV semiconductor. Therefore, for example, when a p-channel MOS transistor including the offset sidewall 303 with an increased thickness is formed and an n-channel MOS transistor (not shown) is further formed, the thickness of the offset sidewall 303 is larger than a thickness of an offset sidewall of the n-channel MOS transistor. Thus, a short channel effect of the p-channel transistor can be prevented.

Moreover, according to the method of this embodiment, a thickness of an offset sidewall can be precisely adjusted by controlling a dose of silicon to be ion implanted and also by controlling an amount of fine particles to be oxidized.

The above-described conditions for annealing in an oxygen atmosphere are mere examples and can be adjusted according to an oxidation amount of the surface portions.

The above-described conditions for ion implantation of silicon are mere examples and can be adjusted according to a desired amount of increase in film thickness. Also, the above-descried temperature and time for lamp annealing are mere examples. Lamp annealing temperature and time are not limited thereto as long as temperature and time are set to be within a range in which silicon nano crystal is deposited in a silicon oxide film. Ions implanted in the step of FIG. 6C are not limited to silicon ions but may be germanium ions or mixture of silicon ions and germanium ions. Moreover, an atmosphere in which lamp annealing 305 is performed is not limited to a nitrogen atmosphere but may be an atmosphere which does not contain oxygen, for example, in an atmosphere of inert gas of argon or the like or in vacuum.

In this embodiment, the thickness of the offset sidewall 303 is 12 nm, a thickness of a surface oxidized layer is 0.5 nm and a volume percentage of the fine particles 308 of group IV semiconductor crystal is 15%. However, the thickness of the offset sidewall 303, the thickness of a surface oxidized layer and the volume percentage of the fine particles 308 are not limited to these values but can be increased/reduced according to a desired thickness of the offset sidewall 303. Also, in this embodiment, a particle diameter of the fine particles 308 is 2 nm but is not limited thereto.

Moreover, the example in which a SiON film is used as the gate insulation film 301 has been described. However, the gate insulation film 301 may be formed of a film of some other material. Furthermore, a gate electrode is not limited to a gate electrode formed of polysilicon but may be a silicide gate electrode of which an upper portion or an entire potion is silicidized with Ni or the like or a metal gate electrode.

Oxidation of the fine particles 308 of FIG. 6E may be performed after formation of the offset sidewall 303.

As has been described, in a semiconductor device according to the present invention and with a method for fabricating the semiconductor device, controllability of an offset sidewall and a thickness of a sidewall can be improved. Therefore, the present invention is useful for improving quality of various circuits including a MIS transistor, specifically, various circuits in which an n-channel MOS transistor and a p-channel MOS transistor are formed on a single substrate.

What is claimed is:

1. A semiconductor device comprising:
a semiconductor substrate;
a first MOS transistor including a first gate insulation film formed on a first region of the semiconductor substrate, a first gate electrode formed on the first gate insulation film, a first sidewall formed of an insulating material on each side surface of the first gate electrode, fine particles of group IV semiconductor crystal implanted at least in part of the first sidewall and a first impurity doped region of a first conductivity type formed in part of the first region located at a side of the first gate electrode and the first sidewall; and
a second MOS transistor including a second gate insulation film formed on a second region of the semiconductor substrate, a second gate electrode formed on the second gate insulation film, a second sidewall formed of an insulating material on each side surface of the second gate electrode so as to have a smaller thickness than a thickness of the first sidewall and a second impurity doped region of a second conductivity type formed in part of the second region located at a side of the second sidewall.

2. The semiconductor device of claim 1, wherein the first sidewall includes a first offset sidewall formed on each side surface of the first gate electrode so as to contain the fine particles implanted therein and a first doped region formation sidewall formed on a side surface of the first offset sidewall,
the second sidewall includes a second offset sidewall formed on each side surface of the second gate electrode and a second doped region formation sidewall formed on a side surface of the second offset sidewall,
the semiconductor device further includes a first extension region formed in each of parts of the semiconductor substrate located in both sides of the first gate electrode, respectively, and under the first offset sidewall so as to contain an impurity of a first conductivity type at a lower concentration than an impurity concentration of the first impurity doped region and a second extension region formed in each of parts of the semiconductor substrate located at both sides of the second gate electrode, respectively, and under the second offset sidewall so as to contain an impurity of a second conductivity type at a lower concentration than an impurity concentration of the second impurity doped region.

3. The semiconductor device of claim 2, wherein each of the first offset sidewall and the second offset sidewall is formed of silicon oxide.

4. The semiconductor device of claim 1, wherein the first sidewall includes a third offset sidewall formed on each side surface of the first gate electrode so as to contain the fine particles implanted therein, a third doped region formation sidewall formed on a side surface of the third offset sidewall and the semiconductor substrate so as to contain the fine particles implanted therein and have an L shape and a fourth doped region formation sidewall formed of a different material from a material of the third doped region formation sidewall on the third doped region formation sidewall, the second sidewall includes a fourth offset sidewall formed on each side surface of the second gate electrode, a fifth doped region formation sidewall formed on a side surface of the fourth offset sidewall and the semiconductor substrate so as to have a smaller thickness than a thickness of the third doped region formation sidewall and an L shape and a sixth doped region formation sidewall formed of a different material from a material of the fifth doped region formation sidewall, and the semiconductor device further includes a third extension region formed in each of parts of the semiconductor substrate located at both sides of the first gate electrode, respectively, and under the third offset sidewall so as to contain an impurity of a first conductivity type at a lower concentration than an impurity concentration of the first doped region and a fourth extension region formed in each of parts of the semiconductor substrate located at both sides of the second gate electrode, respectively, and under the fourth offset sidewall so as to contain an impurity of a second conductivity type at a lower concentration than an impurity concentration of the second impurity doped region.

5. The semiconductor device of claim 4, wherein each of the third doped region formation sidewall and the fifth doped region formation sidewall is formed of silicon oxide, and each of the fourth doped region formation sidewall and the sixth doped region formation sidewall is formed of silicon nitride.

6. The semiconductor device of claim 1, wherein the fine particles are formed of at least one of Si crystal, SiGe mixed crystal and Ge crystal.

7. The semiconductor device of claim 1, wherein surface portions of the fine particles are oxidized.

8. The semiconductor device of claim 1, wherein the first MOS transistor is a p-channel MOS transistor and the second MOS transistor is an n-cannel MOS transistor.

* * * * *